United States Patent [19]

Tults

[11] 4,282,516
[45] Aug. 4, 1981

[54] KEYBOARD ENCODING ARRANGEMENT

[75] Inventor: Juri Tults, Indianapolis, Ind.

[73] Assignee: RCA Corporation, New York, N.Y.

[21] Appl. No.: 48,311

[22] Filed: Jun. 13, 1979

[51] Int. Cl.³ .......................... H04B 1/16; G06F 3/02
[52] U.S. Cl. ............................... 340/365 S; 455/158; 455/175; 455/185
[58] Field of Search ............... 455/175, 177, 179, 183, 455/184, 185, 186, 158; 340/168 B, 168 R, 147 LP, 147 C, 147 CN, 147 F, 365 E, 365 S; 328/70, 74, 75; 334/15; 358/191.1, 194.1

[56] References Cited

U.S. PATENT DOCUMENTS 4,114,103  9/1978  Pflasterer ........................ 455/186

OTHER PUBLICATIONS

Data Sheet for MM54C922/MM74C922 Key Encoder and MM54C923/MM74c923 Key Encoder—National Semiconductor 1977 MOS/LSI Databook, pp. 10-16 to 10-20.
AN-139 Application Note for Keyboard Encoder Circuits—National Semiconductor 1977 MOS/LSI Databook, pp. 10-27 to 10-30.

Primary Examiner—Marc E. Bookbinder
Attorney, Agent, or Firm—Eugene M. Whitacre; Paul J. Rasmussen; Peter M. Emanuel

[57] ABSTRACT

In a television receiver, a keyboard encoding arrangement which makes use of an existing register for storing binary signals representing control information and existing connections coupled to respective stages of the register includes transmission gates for selectively coupling the connections to respective switches of a keyboard. The switches of the keyboard are also coupled to sense circuits for detecting the presence or absence of binary signals. A counter selectively counts in response to sense signals generated by the sense circuits and generates count-representative signals which control the selective coupling and decoupling of binary signals stored in the register to the sense circuits through operated switches of the keyboard. A decoder is responsive to the count signals to generate control signals related to operated switches.

9 Claims, 5 Drawing Figures

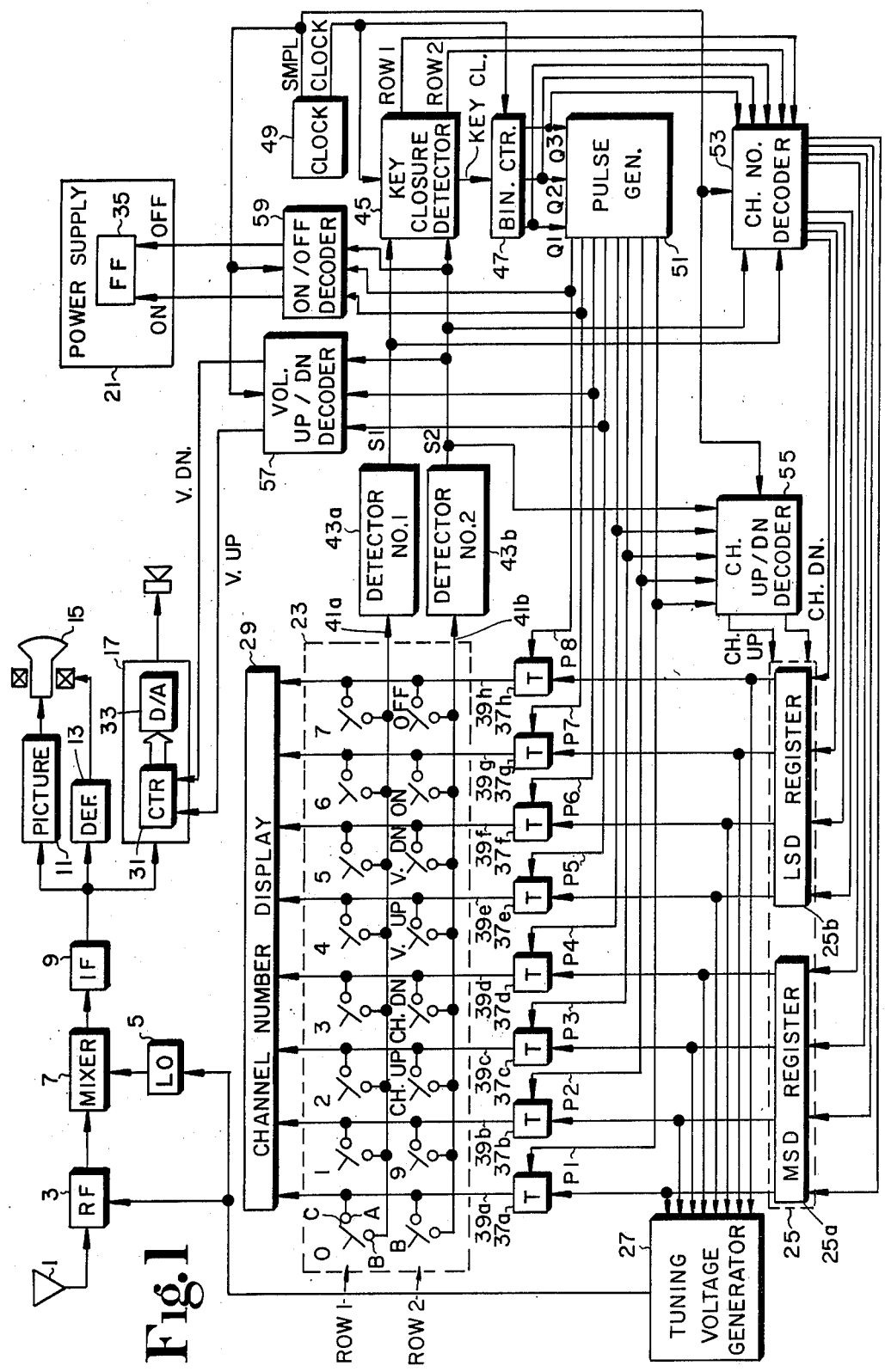

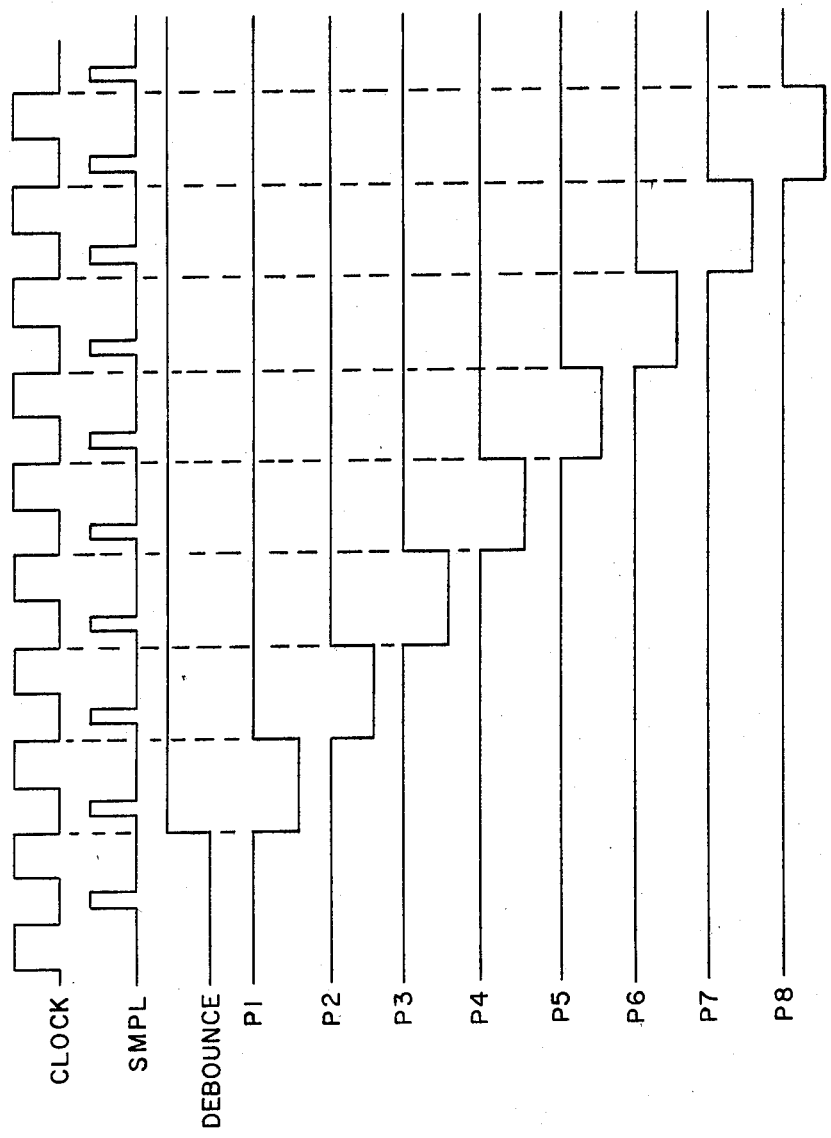

KEYBOARD ENCODING ARRANGEMENT

BACKGROUND OF THE INVENTION

The present invention relates to the field of encoding arrangements for generating groups of coded binary signals representing the operation of respective individual keys of a keyboard.

Keyboards are used in a variety of systems as the user interface. In such systems, there is usually a decoding arrangement for generating groups of binary signals representing the operation of respective individual keys or push buttons.

One type of encoding arrangement includes a static logic network comprising, for example, a diode matrix in which diodes are coupled between row and column conductors associated with respective rows and columns in which the keys are located. When a key is depressed, appropriate diodes are rendered conductive and nonconductive to generate a respective group of coded binary signals representing the operation of the key. Such encoding arrangements tend to be expensive because at least one diode is associated with each key.

Encoding arrangements are also known which employ keys with multiple contacts, each associated with a respective binary signal of a group of encoded binary signals. When a key is depressed, the contacts associated with the key make contact to generate a respective group of coded binary signals representing operation of the key. While such systems tend to be less expensive than the ones utilizing static logic networks, they tend to be less reliable because of their mechanical nature.

Still other encoding arrangements are of a scanning type which, for example, sequentially couple signals to respective row (or column) conductors associated with respective rows (or columns) in which the keys of a keyboard are located. When a key is depressed, one of the sequentially generated signals is coupled through its closed contacts and an associated column (or row) of conductors to an encoding logic network. The encoding logic network generates a group of coded binary signals representing the depressed key in accordance with the time relationship of the received one of the sequentially generated signal. While such types of encoding arrangements tend to be less expensive than the static logic types of encoding arrangements and more reliable than the mechanical types of encoding arrangements, they are intended to be separate parts of a system with which they are employed and are therefore not well suited to being incorporated as an integral part of the system. As a result, such encoding arrangements tend to require extra connections and input terminals for integrated circuits which may be utilized in the system for which the keyboard is the interface.

SUMMARY OF THE PRESENT INVENTION

So that the present keyboard encoding arrangement may utilize an existing register and associated connections of a system for which it is to serve as an interface in a dual capacity and therefore by incorporated as an integral part of the system, the encoding arrangement includes detecting means coupled to keys of the keyboard for generating a sense signal representing the presence of either one of two binary levels of the binary signals stored in the register and the absence of both levels, a counting means responsive to said sense signal for selectively counting and generating count-representative signals, and means for selectively coupling binary signals stored in the register in response to the count-representative signals. Decoder means is responsive to the count-representative signals to generate binary signals representing the operation of the key in response to the count-representative signals.

BRIEF DESCRIPTION OF THE INVENTION

FIG. 1 shows in block diagram form an embodiment of the present keyboard encoding arrangement as it may be employed in a television receiver;

FIG. 2 shows graphical representations of waveforms useful in facilitating an understanding of the arrangement shown in FIG. 1.

DETAILED DESCRIPTION OF THE DRAWING

Figure 4:
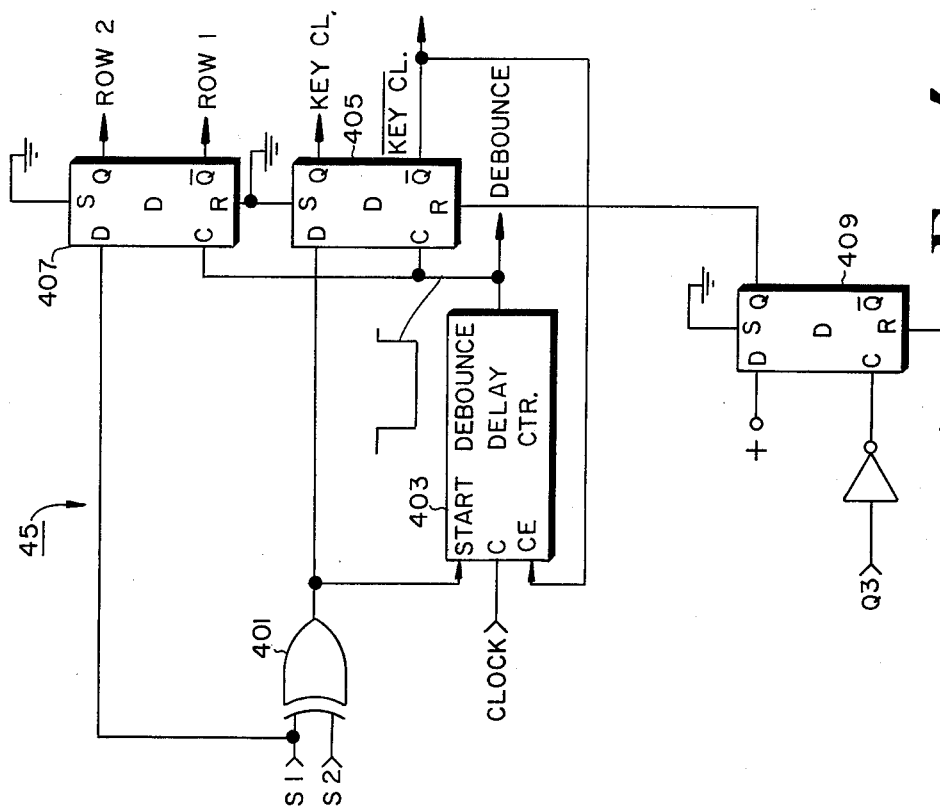
FIGS. 3, 4 and 5 show in logic diagram form implementations of various portions of the arrangement shown in FIG. 1.

As shown in FIG. 1, a television receiver includes an antenna 1, RF signal processing unit 3, local oscillator (LO) 5 and mixer 7, IF signal processing unit 9, picture processing unit 11, deflection unit 13, picture tube 15, sound processing unit 17 and a speaker 19 arranged in a conventional manner. A power supply provides (through connections not shown) operating voltages for various portions of the receiver.

A keyboard 23 is provided by which a user may turn the receiver on and off, control the channel to which the receiver is tuned, and control the volume level. Keyboard 23 includes digit keys or momentary switches for the decimal digits 0 through 9, CH. UP (channel up) and CH. DN (channel down) keys, V. UP (volume up) and V. DN (volume down) keys, and ON and OFF keys. The keys of keyboard 23 are arranged in a rectangular array consisting of 2 rows and 8 columns. Each key includes two contacts and a closure mechanism for coupling the two contacts together when depressed. For purposes of schematic illustrations, each key may be thought of as having fixed contacts A and B and a movable contact C which contacts both contacts A and B when the respective key is depressed. Each key also includes a mechanism (not shown) for returning movable contact C to its normally opened position after the key is released. Of course, it will be appreciated each key may simply include a fixed contact and a movable contact such as by incorporating contacts B and C as a single movable element.

Depressing a digit key corresponding to the tens digit of a channel number and a digit key corresponding to the units digit of a channel number causes binary signals representing, in BCD (binary coded decimal) format, the tens digit to be stored in a MSD (most significant digit) register 25a of a channel number register 25 and binary signals representing, in BCD format, the units digit to be stored in a LSD (least significant digit) register 25b of channel number register 25. Depressing the CH. UP key causes an UP signal to be generated which in turn causes the contents of channel number register 25 to increase. Depressing the CH. DN key causes a CH. DN signal to be generated which in turn causes the contents of channel number register 25 to decrease. For this purpose, channel number register 25 may comprise an up/down counter. The binary contents of channel number register 25 are coupled to a tuning voltage generator 27 which may comprise any one of a number of known arrangements such as a phase locked loop for converting binary signals representing a channel number to a tuning voltage. The tuning voltage is coupled to LO 5 and RF signal processing unit 3 to control the reactance of voltage variable capacitive diodes and thereby tune the receiver. The contents of channel number register 25 are also coupled to a channel number display unit 29 which converts the contents of channel number register 25 into a numerical or digital display of the channel number.

A counter (CTR.) 31 and digital-to-analog converter (D/A) 33 are included in sound processing unit 17 to generate a gain control voltage for determining the volume level of the receiver. Depressing the V. UP key causes a V. UP signal to be generated which in turn causes the contents of the counter in sound processing unit 17 to be increased. Depressing the V. DN key causes a V. DN signal to be generated which in turn causes the contents of the counter to be decreased.

Power supply 21 includes a flip flop (FF) 35 having first and second states corresponding to the on and off conditions of the receiver. Depressing the ON key causes an ON signal to be generated which in turn causes FF 35 to be set in its ON state. Depressing the OFF key causes an OFF signal to be generated which in turn causes FF 35 to be set in its OFF state.

Various television systems are known which include digital signal processing apparatus for controlling the various functions discussed above. Such apparatus is disclosed, for example, in "RCA Television Service Data" File 1978 C-4 and File 1978 C-4-S1 published by RCA Corporation, Indianapolis, Ind., thereby incorporated by reference.

Channel number register 25 and the connections between it and channel number display 29 are used in dual capacities as part of a keyboard encoding arrangement for generating the various system control signals discussed above. Since the keyboard encoding arrangement is an integral part of the control system of the receiver rather than a separate portion, as is customary in prior keyboard encoding arrangements, extra connections and input terminals (or pins) need not be provided to integrated circuits which may encompass various portions of channel number register 25, tuning voltage generator 27 and channel number display 29.

Specifically, eight storage cells or stages of channel number register 25, i.e., four for the tens digit of the channel number and four for the units digit of the channel number, are coupled through respective normally closed transmission gates 37a–37h to respective column conductors 39a–39h. Column conductors 39a–39h are coupled to the A contacts of the two keys in respective columns of keyboard 23 and to channel number display 29.

The B contacts of the eight keys in the first two of keyboard 23 are coupled by a first row conductor 41a to a first detector 43a and the B contacts of the eight keys in the second row of keyboard 23 are coupled by a second row conductor 41b to a second detector 43b. Detectors 43a and 43b generate first (S1) and second (S2) sense signals, respectively. Each sense signal has a low binary or logic level in response to the presence of either a high or low logic level at the input of the respective detector, and has a high logic level when neither of the logic levels are present at the input of the respective detector.

The S1 and S2 sense signals are coupled to a key closure detector 45. When either one of the S1 or S2 signals changes from the high logic level to the low logic level, closure detector 45 generates a key closure (KEY CL.) signal having a high logic level after a predetermined delay selected for "debouncing" the entry. Key closure detector 45 also generates either a high logic level ROW 1 or ROW 2 signal indicative of the row of the depressed key.

The KEY CL. signal is coupled to a binary counter 47 which in response to the KEY CL. signal is enabled to count clock pulses of a CLOCK signal generated by a clock generator 49. Binary output signals Q1, Q2 and Q3 of binary counter 47 representing the count or state of binary counter 47 in BCD format are coupled to a pulse generator 51. In response, pulse generator 51 sequentially generates pulse signals P1–P8 each of which has a low logic level portion related in time to the pulses of the CLOCK signal as shown in FIG. 2.

Pulse signals P1–P8 are coupled to the control inputs of transmission gates 37a–37h. Transmission gates 37a–37h are sequentially rendered nonconductive and thereby sequentially decouple the stages of channel number register 25 from associated column conductors 39a–39h during the low logic level portions of respective pulse signals P1–P8. As a result, the one of sense signals S1 and S2 which was previously caused to have the low logic level (when a key in the respective row of keyboard 23 was originally depressed) will temporarily return to the high logic level. A channel number decoder 53, a channel up/down decoder (DEC.) 55, a volume up/down decoder 57 and an on/off decoder 59 are responsive to the state or count of binary counter 47 as represented by binary signals Q1, Q2 and Q3 pulse signals P1–P8 at the time one of sense signals S1 and S2 returns to the high logic level to generate the control signals for the receiver discussed above. A SMPL (sample) clock signal generated by clock generator 49 and related in time to the CLOCK signal as shown in FIG. 2 is coupled to decoders 53–59 to synchronize their operation to the S1 and S2 sense signals.

Figure 3:
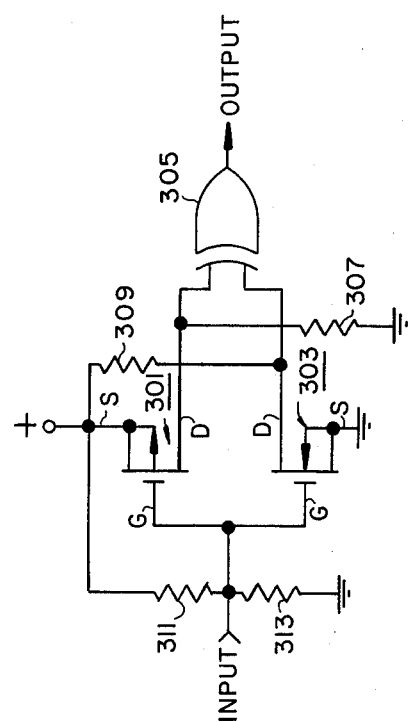
Figure 5:
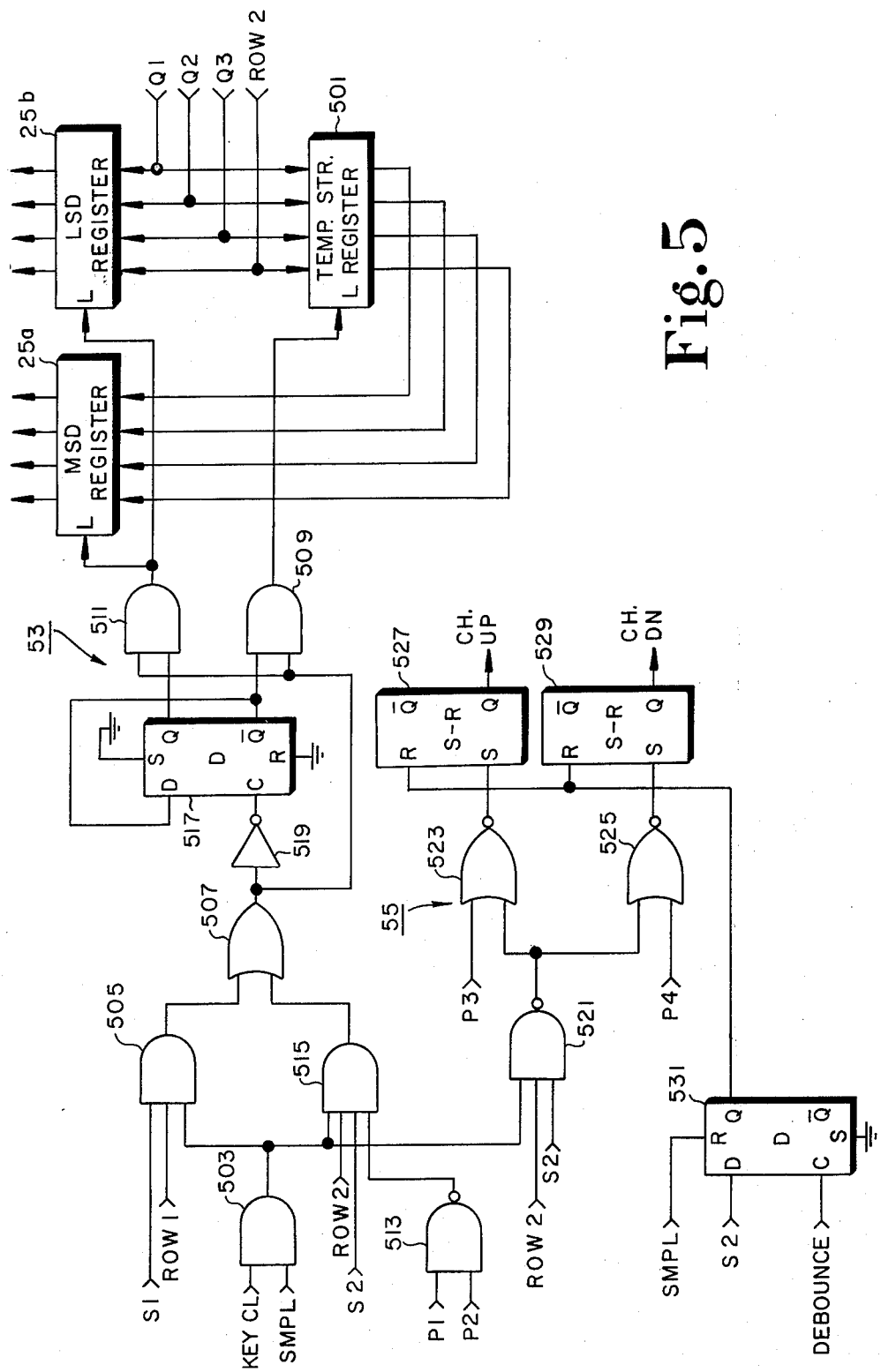

Implementation of various portions of the keyboard decoding arrangements are shown in FIGS. 3–5. Implementations of binary counter 47, clock generator 49 and pulse generator 51 are not shown since these portions may readily be implemented by those skilled in the art from commercially available logic arrangements. Binary counter 47 may, for example, simply comprise a CD4520 integrated circuit. Clock generator 49 may, for example, include a crystal oscillator and a binary counter such as a CD4020 integrated circuit with output signals combined by AND gates to generate the CLOCK and SMPL signals as shown in FIG. 2. Since the stages of channel number register 25 are temporarily decoupled from channel number display 29 by respective transmission gates 37a–37h for a period equal to one cycle of the CLOCK signal, it is desirable that the frequency of the CLOCK signal be selected high enough, e.g., greater than 10 KHz, to prevent flicker in the displayed channel number. Pulse generator 51 may comprise a CD4566 integrated circuit arranged as a one-out-of-eight BCD-to-decimal decoder. The integrated circuits identified above are all available from RCA Corporation, Somerville, N.J.

The implementation of a detector shown in FIG. 3 which may be utilized as detectors 43a and 43b includes a P-channel MOS transistor 301 and an N-channel MOS transistor 303 each having a common source (S) configuration and gate (G) electrode coupled to an input point. The drain of MOS transistor 301 is coupled to an input of an EXCLUSIVE OR gate 305 which is shunted to signal ground through a resistor 307. The drain of MOS transistor 303 is coupled to another input of EXCLUSIVE OR gate 305 which is shunted to a positive supply through a resistor 309. A relatively high impedance voltage divider, including resistors 311 and 313 connected in series between the supply voltage and signal ground, establishes a gate-to-source voltage for MOS transistor 301 greater than its conduction threshold voltage and a gate-to-source voltage for MOS transistor 303 greater than its conduction threshold voltage.

In the absence of both of the high and low logic levels at the input point, i.e., an open circuit at the input point, MOS transistors 301 and 303 are both conductive, resulting in the development of the high logic level at the drain (D) of MOS transistor 301 and the low logic level at the drain of MOS transistor 303. In response, the high logic level is developed at the output point of the detector circuit at the output of EXCLUSIVE OR gate 305. When the high logic level is present at the input point, MOS transistor 301 is rendered nonconductive. As a result, the logic low level is developed at the drain of MOS transistor 301 and the low logic level is maintained at the drain of MOS transistor 303. In response, the low logic level is developed at the output point. When the low logic level is present at the input point, MOS transistor 301 is rendered conductive and MOS transistor 303 is rendered nonconductive. In response, the low logic level is developed at the output point.

The implementation of key closure detector 45 includes an EXCLUSIVE OR gate 401 which generates a high logic level when one and only one of the S1 and S2 sense signals has the low logic level. Therefore, the development of a low logic level at the output of EXCLUSIVE OR gate 401 prevents the entry of information corresponding to the simultaneous depression of a key in row 1 and key in row 2. In response to the generation of the high logic level at the output of EXCLUSIVE OR gate 401, a counter 403, enabled by a high logic level $\overline{\text{KEY CL.}}$ signal (i.e., the logic complement of the KEY CL. signal), starts counting clock pulses of the CLOCK signal. During the counting interval, a DEBOUNCE output signal of counter 403 is caused to be at the low logic level. When a predetermined count is reached, the output signal of counter 403 returns to the high logic level, causing the KEY CL. signal generated at the Q output of a data (D) FF 405 to be set to the level at its D input, which at this time will be the high logic level if the originally depressed key is still depressed. In addition, at this time, $\overline{\text{KEY CL.}}$ is reset to the low logic level. At the same time, a high level ROW 1 or high level ROW 2 signal will be generated by a D FF 407 in accordance with the level of sense signal S1. Another FF 409 is utilized to reset FF 405 in response to a high logic level Q3 signal generated by binary counter 47 at the end of its counting cycle (i.e., when it has counted eight clock pulses).

The implementation of channel number decoder 53 shown in FIG. 5 includes a temporary storage (TEMP. STR.) register 501 and registers 25a and 25b for storing the Q1, Q2 and Q3 signals generated by binary counter 47 and the ROW 2 signal generated by FF 407 of key closure detector 45. Since there are eight keys in each of the two rows of keyboard 23, signals Q1, Q2 and Q3 represent in BCD format the operation of any of the keys in rows 1 and 2. The ROW 2 signal is utilized to distinguish between keys in Row 1 and keys in Row 2. Since all of the keys in row 1 correspond to digits, after the generation of the high logic level of KEY CL. signal if a high logic level S1 sense signal is generated during a corresponding SMPL pulse, a logic arrangement including AND gate 503, AND gate 505, OR gate 507 and AND gates 509 and 511 generates a high logic level signal hich is coupled to L (latch) inputs of register 501 or registers 25a and 25b. In response, the Q1, Q2 and Q3 signals and the ROW 2 signal (which at this point is a low logic level signal) are caused to be stored in either register 501 or registers 25a and 25b. Since only the first two keys in row 2 correspond to digits, after the generation of KEY CL. signal if a high logic level S2 sense signal is generated and one of pulse signals P1 or P2 has the low logic level during a corresponding SMPL pulse, a logic arrangement including NAND gate 513, AND gate 515, OR gate 507, and AND gates 509 and 511 generates a storage enabling signal for register 501 of registers 25a and 25b.

A D FF 517 and an INVERTER 519 control the alternate coupling of the storage enable signals to register 501 or registers 25a and 25b so that the tens digit of the channel number is stored in MSD register 25a and the units digit of the channel number is stored in the LSD register 25b. Specifically, when the first digit is entered, temporary storage register 501 is enabled. When a second digit is entered, channel number registers 25a and 25b are enabled.

Channel up/down decoder 55 includes a NAND gate 521 for generating an enabling signal, after the generation of the KEY CL., if a high level S2 signal is generated during a corresponding SMPL pulse. The enabling signal causes each of NOR gates 523 and 525 to be enabled to respond to the low logic level portions of respective pulse signals P3 and P4 and thereby set one of S-R (set-reset) FFs 527 and 529 accordingly. The Q output of FF 527 corresponds to the CH. UP control signal, while the Q output of FF 529 corresponds to the CH. DN control signal. Each of FF 527 and 529 is reset in response to a reset signal generated by a D FF 531 when the depressed one of the CH. UP or CH. DN key is released, thereby causing the S2 signal to rise to a high logic level.

Volume up/down decoder 57 and on/off decoder 59 may have implementations similar to the implementation of channel up/down decoder 55 with the exception that their implementations should respond to pulse signals P5 and P6 and pulses P7 and P8, respectively, rather than pulses P3 and P4. Therefore, implementations of decoders 57 and 59 are not shown.

It is noted that the simultaneous depression of two or more keys in a row of keyboard 23 will not result in the entry of information since under these conditions a stage of channel number register 25 is always coupled to the respective one of detectors 43a and 43b even though transmission gates 37a–37h are sequentially rendered nonconductive. As a result, the appropriate one of sense signals S1 and S2 will not temporarily return to the high logic level after the generation of the KEY CL. signal and no entry will be made.

While the present invention has been described with reference to a channel number register and associated connections which are utilized in dual capacities as part of the system to be controlled as well as part of the keyboard encoding arrangement, it is contemplated that any register and associated connection within the system may so be utilized. Furthermore, while reference has been made to rows and columns, it will be understood that these terms are merely descriptive of the particular geometric configuration of the array of keys. These and other modifications are intended to be included within the scope of the present invention as defined in the following claims.

What is claimed is:

1. In a system, apparatus comprising:
   control means for controlling at least one function of said system;
   a plurality of switches for selectively controlling said function;
   register means for storing binary signals;
   detecting means for generating a sense signal representing the presence and absence of one of said binary signals;
   a source of clock signals;
   counting means responsive to said sense signal for selectively counting said clock signals and generating count-representative signals;
   selective coupling means for selectively coupling said binary signals stored in said register means to respective ones of said plurality of said switches in response to said count-representative signals;
   said switches being coupled between said selective coupling means and said detector means for coupling said binary signals coupled to them from said register means by said selective coupling means to said detecting means when said switches are operated; and
   decoder means responsive to at least said count-representative signals for generating control signals associated with the operation of respective ones of said switches for said control means to effect the control of said function.

2. The apparatus recited in claim 1 wherein:
   said register means is coupled to said decoder means to store binary signals related to at least some of said control signals.

3. The apparatus recited in claim 2 wherein:
   said decoder means is responsive to said sense signal and said count-representative signal to generate said control signals.

4. The apparatus recited in claim 3 wherein:
   said sense signal has a first level representing the presence of either one of two levels of said binary signals and a second level representing the absence of both of said two levels of said binary signals;
   said counting means being enabled to count when said sense signal changes from one of said first and second levels of said sense signal to the other one of said first and second levels;
   said decoder means generating a control signal in response to said count-representative signals generated when said sense signal changes from said other one of said first and second levels to said one of said first and second levels.

5. The apparatus recited in claim 3 wherein:
   said plurality of switch means includes respective normally opened contact mechanisms;
   said register means includes a plurality of stages each for storing a respective binary signal;
   said selective coupling means includes a plurality of normally conductive transmission means coupled between respective pairs of said mechanisms and said stages;
   said detecting means is coupled to said contact mechanisms;
   said transmission means being caused to sequentially decouple and then again couple respective pairs of said contact mechanisms and said stages after the generation of said first level of said sense signal in response to said count-representative signals; and
   said decoder means generating binary signals representing said control signals and associated with the operation of respective ones of said contact mechanisms in response to said count-representative signals when said second level of said sense signal is generated after the generation of said first level of said sense signal.

6. The apparatus recited in claim 5 wherein:
   said plurality of switches is partitioned into a first plurality and a second plurality;
   each of said switches of both said first and second pluralities of switches includes first and second contact points and closure means for coupling said first and second contact points together when operated;
   a first conductor is coupled to said first contact point of each of said switches in said first plurality;
   a second conductor is coupled to said first contact point of each of said switches in said second plurality;
   a plurality of third conductors is coupled to respective pairs of said second contacts of said first and second pluralities of switches;
   said transmission means are coupled between respective pairs of said third conductors and said stages;
   said detecting means includes first sense means coupled to said first conductor for generating a first sense signal and second sense means coupled to said second conductor for generating a second sense signal, each of said sense signals having said first level in response to the presence of either one of said two levels of said binary signals stored in said storage register means and having said second level in response to the absence of said two levels;
   said counter means sequentially causes ones of said transmission means to decouple and then again couple respective pairs of said third conductors and said stages after the generation of said first level of either of said sense signals; and
   said decoder means generates said binary signals representing ones of said control signals associated with the operation of respective ones of said closure means of said first plurality of switches in response to said count-representative signals when said second level of said first sense signal is generated after the generation of said first level of said first sense signal and generates binary signals representing ones of said control signals associated with the operation of respective ones of said closure means of said second plurality of switches in response to said count-representative signals when said second level of said second sense signal is generated after the generation of said first level of said second sense signal.

7. The apparatus recited in claim 6 wherein:
   said counting means counts to a number equal to the highest number of switches in said first and second pluralities.

8. The apparatus recited in claim 6 wherein:
   said register means stores binary signals representing channel numbers;
   said control means includes tuning voltage means for generating tuning voltages corresponding to said channel numbers in response to said binary signals stored in said register means and channel number display means for displaying said channel numbers in response to said binary signals stored in said register means; and said third conductors are coupled to at least one of said tuning voltage means and said channel number display means.

9. The apparatus recited in claim 8 wherein:

said third conductors are coupled to said channel number display means; and said counting means includes clock means for generating a clock signal having a frequency selected to inhibit flicker of the display of said channel numbers.

* * * * *

UNITED STATES PATENT AND TRADEMARK OFFICE
CERTIFICATE OF CORRECTION

PATENT NO. : 4,282,516
DATED : 8-4-81
INVENTOR(S) : Juri Tults

It is certified that error appears in the above—identified patent and that said Letters Patent is hereby corrected as shown below:

Column 3, line 53, change "two" to --row--.

Column 6, line 4, change "hich" to --which--.

Column 6, line 16, change "of" to --or--.

Column 6, line 34, after "output" insert --signal--.

Signed and Sealed this

Ninth Day of March 1982

[SEAL]

Attest:

GERALD J. MOSSINGHOFF

Attesting Officer

Commissioner of Patents and Trademarks